(12) United States Patent
Wang et al.

(10) Patent No.: US 11,489,129 B2
(45) Date of Patent: Nov. 1, 2022

(54) DISPLAY UNIT, DISPLAY SUBSTRATE AND DRIVING METHOD THEREOF, AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Min Wang, Beijing (CN); Rui Xu, Beijing (CN); Chao Tian, Beijing (CN); Zhe Wang, Beijing (CN); Shuo Li, Beijing (CN); Xiang Yuan, Beijing (CN); Qingqing Ma, Beijing (CN); Wenyuan Xi, Beijing (CN); Yinan Gao, Beijing (CN)

(73) Assignees: BEIJING BOE OPTOELECTRONICS TECHNOLOGY CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 75 days.

(21) Appl. No.: 17/041,334

(22) PCT Filed: Jan. 21, 2020

(86) PCT No.: PCT/CN2020/073555
§ 371 (c)(1),
(2) Date: Sep. 24, 2020

(87) PCT Pub. No.: WO2020/151711
PCT Pub. Date: Jul. 30, 2020

(65) Prior Publication Data
US 2021/0083217 A1 Mar. 18, 2021

(30) Foreign Application Priority Data

Jan. 21, 2019 (CN) .......................... 201910053137.6

(51) Int. Cl.
*H01L 51/50* (2006.01)
*G09G 3/20* (2006.01)
(Continued)

(52) U.S. Cl.
CPC ....... *H01L 51/5012* (2013.01); *G09G 3/2003* (2013.01); *G09G 3/30* (2013.01);
(Continued)

(58) Field of Classification Search
CPC ............. H01L 51/5012; H01L 51/5056; H01L 51/5072; H01L 51/56; G09G 3/2003; G09G 3/30
(Continued)

(56) References Cited

U.S. PATENT DOCUMENTS 10,996,498 B2 * 5/2021 Hsieh .................. G06F 3/04166
11,237,662 B2 * 2/2022 Liao ..................... G06F 3/0412
(Continued)

FOREIGN PATENT DOCUMENTS

CN 1530913 A 9/2004
CN 1599529 A 3/2005
(Continued)

OTHER PUBLICATIONS

First Office action dated Mar. 9, 2020 for application No. CN201910053137.6 with English translation attached.
(Continued)

*Primary Examiner* — Prabodh M Dharia
(74) *Attorney, Agent, or Firm* — Nath, Goldberg & Meyer; Joshua B. Goldberg

(57) ABSTRACT

A display unit, a display substrate, a driving method of the display substrate and a display device are provided. The
(Continued)

display unit includes a first electrode, a second electrode disposed above the first electrode, a functional layer disposed between the first electrode and the second electrode, and the functional layer includes a luminescent material with electrical bistable characteristics. The display unit is provided with the functional layer of the luminescent material with the electrical bistable characteristics, so that the display unit can emit light when being in a high conductivity state and still keep emitting light after being de-energized, and does not emit light when being in a low conductivity state, thereby realizing display and non-display of the display unit.

20 Claims, 3 Drawing Sheets

(51) Int. Cl.
| | | |
|---|---|---|
| *G09G 3/30* | (2006.01) | |
| *H01L 51/56* | (2006.01) | |
| *H01L 27/32* | (2006.01) | |
| *H01L 51/00* | (2006.01) | |

(52) U.S. Cl.
CPC ...... *H01L 51/5056* (2013.01); *H01L 51/5072* (2013.01); *H01L 51/56* (2013.01); *G09G 2330/021* (2013.01); *H01L 27/3211* (2013.01); *H01L 27/3244* (2013.01); *H01L 51/004* (2013.01); *H01L 51/0052* (2013.01); *H01L 51/0085* (2013.01); *H01L 2251/558* (2013.01)

(58) Field of Classification Search
USPC .......................... 345/690; 313/506; 365/115
See application file for complete search history.

(56) References Cited

U.S. PATENT DOCUMENTS

| | | | |
|---|---|---|---|
| 2002/0190664 A1 | 12/2002 | Tanaka et al. | |
| 2004/0027849 A1* | 2/2004 | Yang | H01L 45/14 365/115 |
| 2007/0273279 A1* | 11/2007 | Kobayashi | H01L 51/5265 313/506 |
| 2016/0260789 A1* | 9/2016 | Zhang | H01L 51/5209 |
| 2017/0271624 A1* | 9/2017 | Hua | H01L 51/5275 |
| 2017/0372113 A1* | 12/2017 | Zhang | H01L 27/3244 |

FOREIGN PATENT DOCUMENTS

| | | |
|---|---|---|
| CN | 101161698 A | 4/2008 |
| CN | 101930146 A | 12/2010 |
| CN | 102244166 A | 11/2011 |
| CN | 105336859 A | 2/2016 |
| CN | 108447989 A | 8/2018 |
| CN | 109725471 A | 5/2019 |
| KR | 20180037684 A | 4/2018 |

OTHER PUBLICATIONS

Second Office action dated Aug. 3, 2020 for application No. CN201910053137.6 with English translation attached.
Third Office action dated Dec. 9, 2020 for application No. CN201910053137.6 with English translation attached.
Han, Hui-zhen, et al., "Organic Electrical Bistable Devices Based on Poly [2-methoxy-5-(20-ethyl-hexyloxy)-1' 4-phenyl vinylene] / poly (ethylene glyco) Films", Chinese Journal of Luminescence, Jun. 2017, with English translation attached.
Wang, Min, et al., "Electrical Bistable Devices Based on Poly [2-methoxy-5-(2-ethylhexyloxy)-1' 4-phenylenevinylene] / Tris (2-phenylpyridine) iridium (III)"; Chinese Journal of Luminescene, May 2017; with English translation attached.

* cited by examiner

[FIG. 1]
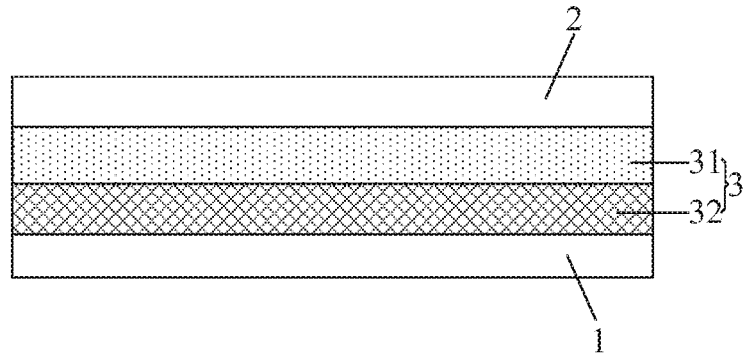
[FIG. 2]
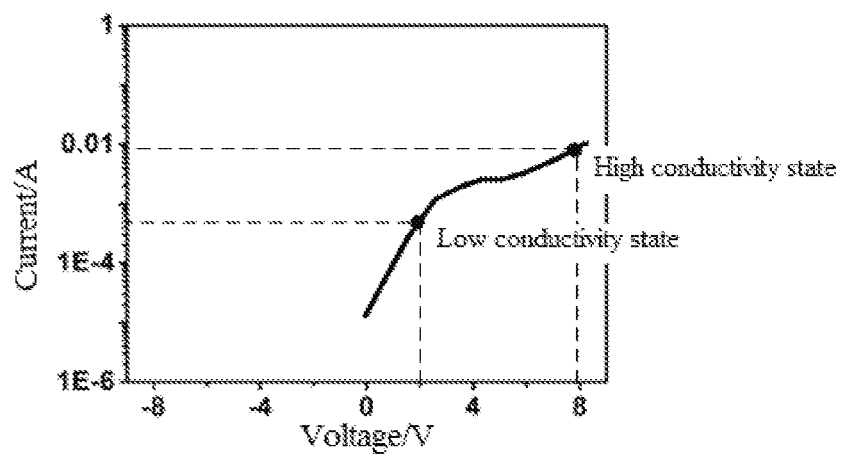
[FIG. 3]
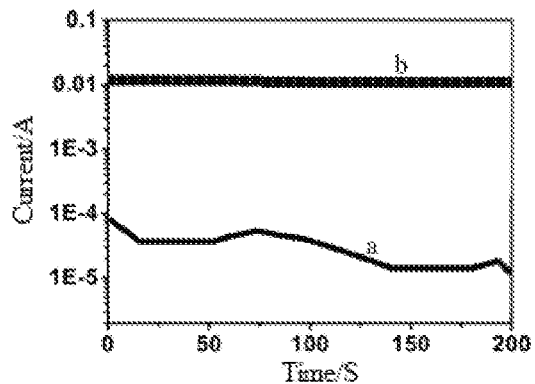

[FIG.4]
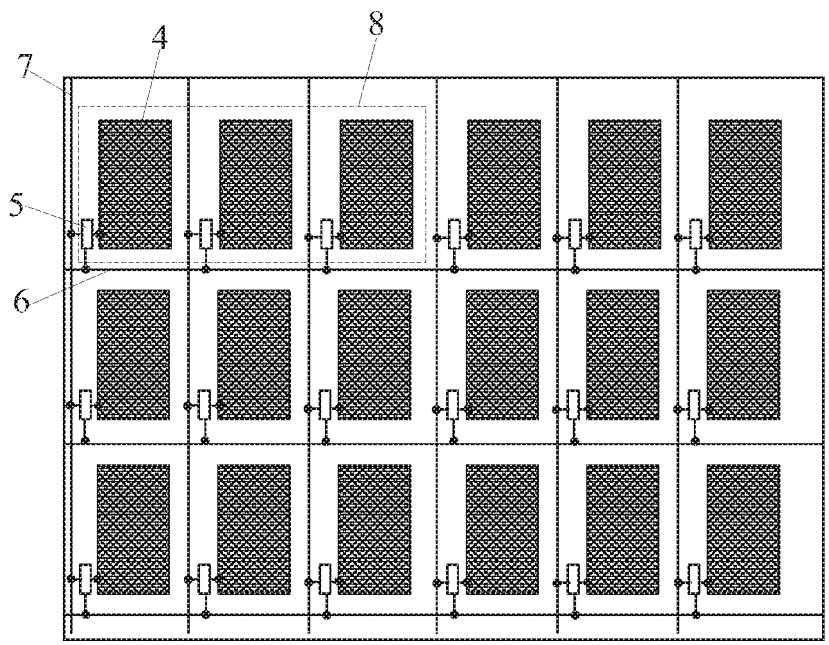
[FIG.5]
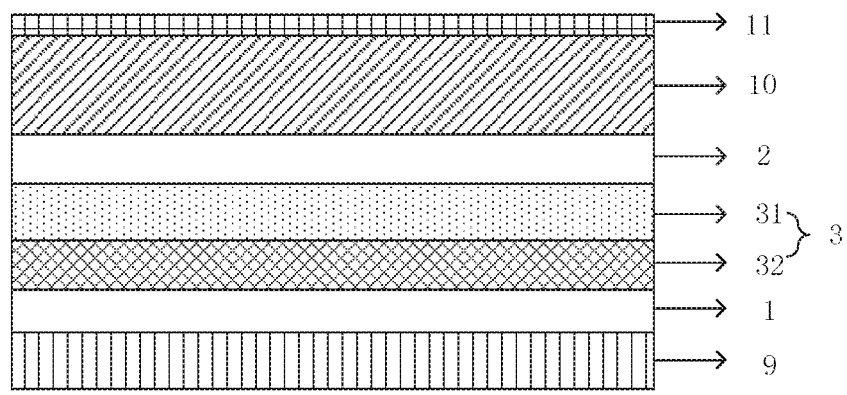

[FIG.6]
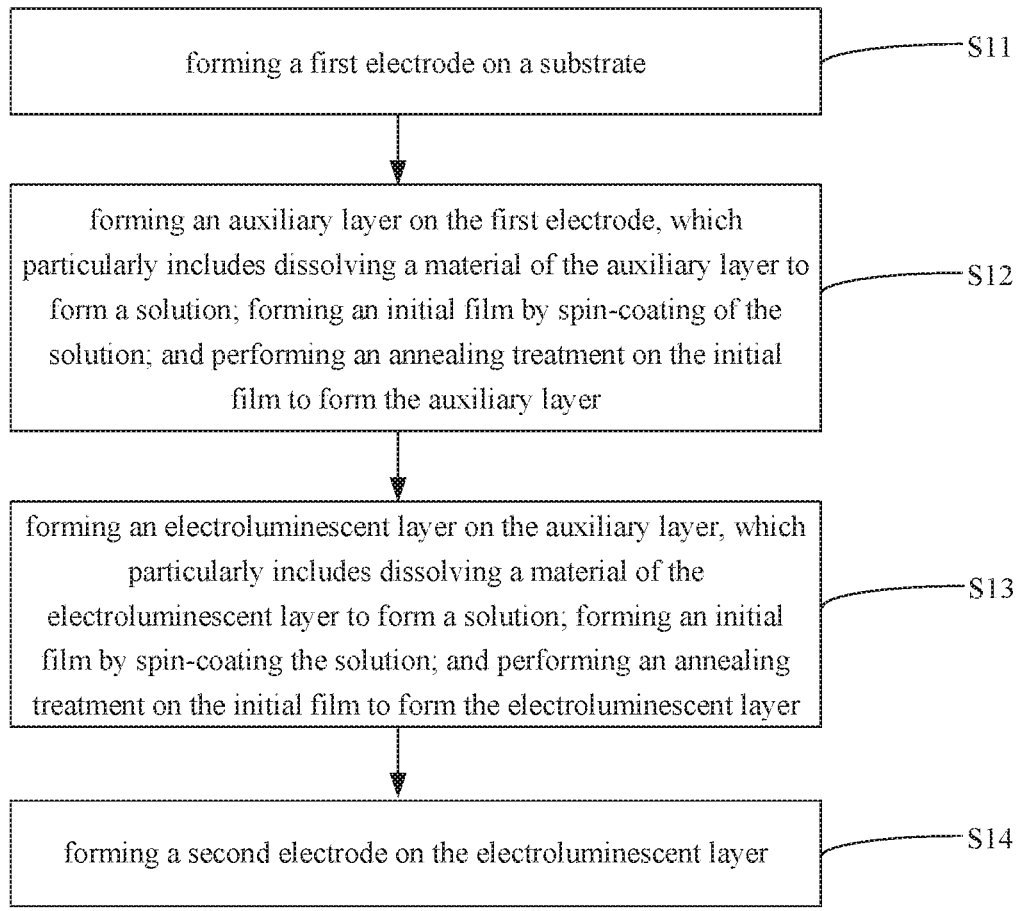
[FIG.7]
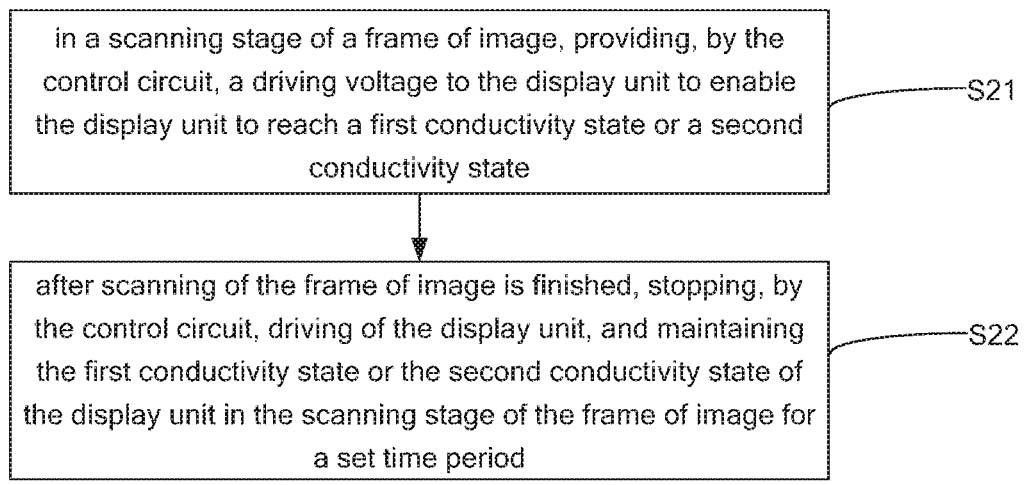

ND DRIVING METHOD THEREOF, AND DISPLAY DEVICE

DISPLAY UNIT, DISPLAY SUBSTRATE AND DRIVING METHOD THEREOF, AND DISPLAY DEVICE

CROSS-REFERENCE TO RELATED APPLICATIONS

This is a National Phase Application filed under 35 U.S.C. 371 as a national stage of PCT/CN2020/073555, filed Jan. 21, 2020, an application claiming the benefit of Chinese Application No. 201910053137.6, filed Jan. 21, 2019, the content of each of which is hereby incorporated by reference in its entirety.

TECHNICAL FIELD

The present disclosure relates to the field of display technology, and in particular to a display unit, a display substrate and a driving method thereof, and a display device.

BACKGROUND

At present, electroluminescent display technology such as LEDs and LCDs have been developed, but when displaying, an electroluminescent display device such as an LED and an LCD needs to be driven by an applied voltage to display. However, in the field of a billboard, an electronic price tag and the like, a target image is usually kept unchanged for a long time after being refreshed, and at this time, the power consumption of the electroluminescent display device such as the LED and the LCD is very large, which cannot meet the requirements of the user for lower power consumption.

SUMMARY

The disclosure provides a display unit, a display substrate and a driving method thereof, and a display device.

The display unit of the present disclosure includes a first electrode, a second electrode disposed on the first electrode, and a functional layer disposed between the first electrode and the second electrode, and the functional layer includes a luminescent material having electrical bistable characteristics.

In some embodiments, the functional layer includes an electroluminescent layer and an auxiliary layer, and the electroluminescent layer and the auxiliary layer are superposed on each other.

In some embodiments, the electroluminescent layer is made of any one of MEH-PPV, $Ir(ppy)_3$, $Alq_3$, PPV, an anthracene organic material, and a fluorene organic material and the auxiliary layer is made of any one of PEG, PEO, PEDOT and PMMA.

In some embodiments, the first electrode is made of a metal conductive material, and the second electrode is made of a transparent conductive material.

In some embodiments, the auxiliary layer is disposed on the first electrode, the electroluminescent layer is disposed on the auxiliary layer, and the second electrode is disposed on the electroluminescent layer, and the electroluminescent layer is made of $Ir(ppy)_3$ and the auxiliary layer is made of PEO.

In some embodiments, a thickness of the electroluminescent layer is in a range of 10 nm to 30 nm, and/or a thickness of the auxiliary layer is in a range of 30 nm to 50 nm.

The present disclosure further provides a display substrate, which includes a plurality of the above display units arranged in an array, and a control circuit, and the control circuit is coupled to each of the plurality of display units, and is configured to control the display unit to be in a first conductivity state or a second conductivity state to enable the display unit to emit light or not to emit light, so as to realize display of the display substrate.

In some embodiments, the control circuit includes a plurality of switching transistors, a plurality of gate lines and a plurality of data lines, the plurality of switching transistors are disposed in an array, each of the plurality of switching transistors includes a gate, a first electrode and a second electrode, the gates of one row of the switching transistors are correspondingly coupled to one of the plurality of gate lines, the first electrodes of one column of the switching transistors are correspondingly coupled to one of the plurality of data lines, the second electrode of each of the plurality of switching transistors is correspondingly coupled to one of the plurality of display units, and the second electrode of the switching transistor is coupled to the first electrode of the display unit; and the second electrode of the display unit is coupled to a common voltage terminal.

In some embodiments, the electroluminescent layers of the plurality of display units are made of a same material.

In some embodiments, a display unit combination is formed by a plurality of adjacent display units, and the electroluminescent layers of different display units in the display unit combination are made of luminescent materials of different colors.

In some embodiments, the display unit combination is formed by three adjacent display units in a row direction, a column direction or a diagonal direction.

In some embodiments, the electroluminescent layers of the three adjacent display units in the display unit combination include a red electroluminescent material, a green electroluminescent material and a blue electroluminescent material, respectively.

In some embodiments, the red electroluminescent material is MEH-PPV, the green electroluminescent material is $Ir(ppy)_3$ or $Alq_3$, and the blue electroluminescent material is PPV, an anthracene organic material or a fluorene organic material.

The present disclosure also provides a display device including the above display substrate.

The present disclosure also provides a driving method of the display substrate, including: in a scanning stage of a frame of image, providing, by the control circuit, a driving voltage to the display unit to enable the display unit to reach a first conductivity state or a second conductivity state; and after scanning of the frame of image is finished, stopping, by the control circuit, driving of the display unit such that the display unit maintains the first conductivity state or the second conductivity state of the display unit in the scanning stage of the frame of image for a set time period.

In some embodiments, the display unit is made of a green electroluminescent material, and a driving voltage for enabling the display unit to be in the first conductivity state is in a range of 8V to 18V; the display unit is made of a red electroluminescent material, and a driving voltage for enabling the display unit to be in the first conductivity state is in a range of 6V to 18V; and the display unit is made of a blue anthracene material, and a driving voltage for enabling the display unit to be in the first conductivity state is in a range of 16V to 18V.

The present disclosure also provides a manufacturing method of a display substrate, including: forming a first electrode on a base substrate; forming an auxiliary layer on the first electrode; forming an electroluminescent layer on the auxiliary layer; and forming a second electrode on the electroluminescent layer; wherein the electroluminescent layer includes a luminescent material with electrical bistable characteristics.

In some embodiments, the forming an auxiliary layer includes: dissolving a material of the auxiliary layer to form a solution; forming an initial film by spin-coating of the solution; and performing an annealing treatment on the initial film to form the auxiliary layer.

In some embodiments, the forming an electroluminescent layer includes: dissolving a material of the electroluminescent layer to form a solution; forming an initial film by spin-coating of the solution; and performing an annealing treatment on the initial film to form the electroluminescent layer.

In some embodiments, the electroluminescent layer is made of Ir(ppy)$_3$, and the auxiliary layer is made of PEO.

BRIEF DESCRIPTION OF THE DRAWINGS

FIG. 1 is a cross-sectional view of a display unit according to some embodiments of the present disclosure;

FIG. 2 is a schematic voltage-current chart illustrating the display unit reaching a low conductivity state and a high conductivity state during a gradually increasing voltage process according to some embodiments of the present disclosure;

FIG. 3 is a schematic chart illustrating a test of the high conductivity state and the low conductivity state of the display unit after power is removed according to some embodiments of the present disclosure;

FIG. 4 is a top view of a display substrate according to some embodiments of the present disclosure:

FIG. 5 is a cross-sectional view of a display device according to some embodiments of the present disclosure:

FIG. 6 shows a flow chart of a method for manufacturing a display unit according to some embodiments of the present disclosure; and FIG. 7 shows a flow chart of a method for driving a display substrate according to some embodiments of the present disclosure.

DETAILED DESCRIPTION

In order to make a person skilled in the art better understand the technical solution of the present disclosure, a display unit, a display substrate and a driving method thereof, and a display device provided in the present disclosure are described in further detail below with reference to the accompanying drawings and the detailed description.

In the related art, approaches for implementing the electronic paper technology mainly include a cholesteric liquid crystal display technology, an electrophoretic display technology (EPD), an electrowetting display technology, and the like. The electrophoretic display technology is most widely used, and relies on moving of charged black, white and red particles under an external electric field to display an image. When the external electric field is removed, the black, white and red particles remain still to form a bistable state, that is, the original image is still displayed after the power is off, realizing low power consumption. Due to the color limitation of the charged particles, only an image of black, white, and red can be displayed, and full-color display cannot be achieved, thereby limiting the application of the electronic paper in the full-color display. Meanwhile, due to the self-diffusion characteristics of charged particles and the like, a target image meeting requirements of a display image quality can be normally displayed only after being subjected to inverting, shaking, writing and the like during an scanning stage, so that a refreshing time of the image is long and can reach hundreds of milliseconds, and the requirements of a user on a quick refreshing frequency cannot be met; further, black and white particles are used for display, which leads to a higher probability of undesirable conditions such as mottling occurrence.

The present embodiment provides a display unit, as shown in FIG. 1, including a first electrode 1, a second electrode 2 disposed above the first electrode 1, and a functional layer 3 sandwiched between the first electrode 1 and the second electrode 2, and the functional layer 3 includes a luminescent material having electrical bistable characteristics.

The functional layer 3 has electroluminescent characteristics and electrical bistable characteristics, specifically: the functional layer 3 may emit light at a first set voltage and is in a high conductivity state (i.e., a first conductivity state), and when the display unit is powered off, the functional layer 3 is still in the high conductivity state and keeps emitting light; the functional layer 3 is also capable of being in a low conductivity state (i.e., a second conductivity state) at a second set voltage and the functional layer 3 does not emit light when being in the low conductivity state.

As shown in FIG. 2, an applied voltage of 0V~8V is applied to the display unit, current flowing through the functional layer 3 in the display unit changes significantly, i.e. from low current to high current, and when the applied voltage is 1V~2V, the display unit is in the low conductivity state (i.e. off state), and the display unit does not emit light; when the applied voltage is 8V, the display unit is in the high conductivity state (i.e., on state), and the display unit emits light at the moment and keeps emitting light after being de-energized. As shown in FIG. 3, firstly, an external voltage of 2V is applied to the display unit, at this time, the display unit is in the low conductivity state, and the current of the display unit is tested after the display unit is de-energized, the testing is performed for 2000 times, and an interval between two adjacent testing is 0.1 second, so as to obtain a low conductivity state curve a of the display unit after being de-energized; then, applying the external voltage of 8V, at this time, the display unit is in the high conductivity state, and testing the current of the display unit after the display unit is de-energized, this testing is performed for 2000 times, and the interval between two adjacent testing is 0.1 second, so as to obtain a high conductivity state curve b of the display unit after being de-energized; the electrical bistable characteristics of the display unit can be seen from the curve a and the curve b.

The bistable working mechanism of the light emitting electrical bistable device provided by the present disclosure is briefly described. When the voltage is applied from 0V to 8V, the current of the electrical bistable device is low and the electrical bistable device is in the low conductivity state; when the voltage is greater than or equal to 8V, the current is high and the electrical bistable device is in the high conductivity state. At this point, the electrical bistable device remains in the high conductivity state when the applied voltage is removed. The reason for forming the bistable state is due to traps in the material, in the process of applying a voltage from 0V to 8V, electrons and holes directionally move under an electric field to fill the traps, and when the voltage reaches 8V, the traps are filled, and the electrons and the holes in the material are conducted, so that a high conductivity state is formed. After the power is off, there is no high voltage to drive the electrons and the holes in the trap, so that the electrons and the holes cannot jump out of the trap, and the electrons and the holes outside the trap can still be conducted due to the existence of the built-in electric field, so that the electrical bistable device is still in the high conductivity state. If the voltage is reduced after 8V, the current is still high because the trap is filled up and is in an ohmic contact, and when the voltage is close to −8V, the current is low because electrons and holes in the trap are reversely swept out, and the electrical bistable device is in the low conductivity state.

By arranging the functional layer 3 of the luminescent material with the electrical bistable characteristics, the display unit can realize emitting light when being in the high conductivity state and still keep emitting light after power is removed, and does not emit light when being in the low conductivity state, thereby realizing display and non-display of the display unit. Compared with the existing display unit which needs to be continuously driven to display under an electric field, the display power consumption of the display unit can be reduced, and meanwhile, the display unit can be suitable for display of an electronic paper.

In the present embodiment, the functional layer 3 includes an electroluminescent layer 31 and an auxiliary layer 32, and the electroluminescent layer 31 and the auxiliary layer 32 are superposed on each other. Wherein the electroluminescent layer 31 is capable of emitting light at a certain voltage and is not emitting light at a second set voltage. The auxiliary layer 32 and the electroluminescent layer 31 combine to make the functional layer 3 have the electrical bistable characteristics as mentioned above, and the auxiliary layer 32 can increase the on-off ratio of the functional layer 3 having the electrical bistable characteristics, thereby improving the contrast ratio between the display and the non-display of the display unit.

Reference herein to "are superposed on each other" includes the electroluminescent layer 31 being disposed above the auxiliary layer 32, or the auxiliary layer 32 being disposed above the electroluminescent layer 31.

As shown in FIG. 1, the electroluminescent layer 31 is closer to a light-exit-side electrode of the display unit than the auxiliary layer 32, i.e. the second electrode 2. However, the present disclosure is not limited thereto, and it should be noted that an up-and-down position relationship between the electroluminescent layer 31 and the auxiliary layer 32 may also be set according to an electroluminescent material of the electroluminescent layer and a material of the auxiliary layer, such as an electron transport material and a hole transport material, and design requirements of the function of the first electrode and the second electrode.

In this embodiment, the electroluminescent layer 31 is made of any one of MEH-PPV (poly [2-methoxy-5-(2-ethylhexyloxy)] p-phenylene vinylene), Ir(ppy)$_3$ (tris (2-phenylpyridine) iridium), Alq$_3$ (8-hydroxyquinoline aluminum (Alq$_3$), PPV (polyparastyrene), anthracene-based organic material, and fluorene-based organic material, and the auxiliary layer 32 is made of any one of PEG (polyethylene glycol), PEO (polyethylene oxide), PEDOT (poly (3, 4-ethylenedioxythiophene)), PMMA (polymethyl methacrylate) material. MEH-PPV is a red electroluminescent material, Ir(ppy)$_3$ and Alq$_3$ are green electroluminescent materials, and PPV, the anthracene-based organic material, and the fluorene-based organic material are blue electroluminescent materials.

In order to improve display brightness of the electrical bistable display unit, the applied voltage of the display unit with the green electroluminescent material in the high conductivity state may be increased to 8V~8V. The applied voltage of the display unit with the red electroluminescent material in the high conductivity state is increased to 6V~18V and the applied voltage of the display unit with the blue anthracene material in the high conductivity state is increased to 16V~18V. In summary, the turn-on voltage of the display unit can be set to be more than 16V. and the specific settings may be performed according to requirements of the display brightness.

In this embodiment, the first electrode 1 is made of a metal conductive material, which may be a metal such as Al and Cu, and the second electrode 2 is made of a transparent conductive material, such as ITO. The first electrode 1 may be formed by magnetron sputtering, and the second electrode 2 may be formed by vacuum evaporation. The electroluminescent layer 31 and the auxiliary layer 32 in the functional layer 3 may be formed by vacuum evaporation or spin-coating.

For example: in the functional layer 3, an Ir(ppy)$_3$ material may be used for the electroluminescent layer 31, and a PEO material may be used for the auxiliary layer 32. The Ir(ppy)$_3$ layer and the PEO layer may be prepared by the following procedure: the PEO material is usually dissolved by a chlorobenzene solution to prepare a solution with a concentration range of 8-20 mg/mL, and the concentration range is usually 17 mg/mL. Of course, PEO may also be dissolved in any other organic solvent to form a solution. Ir(ppy)$_3$ is usually dissolved by DMF (dimethylformamide) reagent to prepare a solution with the concentration range of 2-12 mg/mL, usually 5 mg/mL. Of course, Ir(ppy)$_3$ may alternatively be dissolved in any other organic solvent to form a solution.

The PEO layer is prepared by a spin-coating process, the utilized apparatus is a spin coater, the set range of the rotation speed of the spin coater is 500-1500 r/min, usually 1000 r/min, and the rotation time is 30-90 s, usually 40 s. After the layer is formed, the annealing temperature range is 30-80° C., usually 50° C., the annealing time is 20-60 min, usually 30 min, and the thickness range of the resultant layer is 30-50 nm.

The Ir(ppy)$_3$ layer is prepared by a spin-coating process, the utilized apparatus is a spin coater, the set range of the rotation speed of the spin coater is 500-1500 r/min, usually 1000 r/min, and the rotation time is 30-90 s, usually 40 s. After the layer is formed, the annealing temperature range is 80-120° C., usually 100° C., the annealing time is 10-30 min, usually 20 min. Of course, Ir(ppy)$_3$ may alternatively be formed by vacuum deposition with a thickness range of 10-30 nm.

In summary, in the present embodiment, the method for manufacturing the display unit includes steps S11 to S14, as shown in FIG. 6.

In step S11, a first electrode is formed on a substrate.

In step S12, an auxiliary layer is formed on the first electrode, which particularly includes: dissolving a material of the auxiliary layer to form a solution; forming an initial film by spin-coating of the solution; and performing an annealing process on the initial film to form the auxiliary layer.

In step S13, an electroluminescent layer is formed on the auxiliary layer, which particularly includes: dissolving a material of the electroluminescent layer to form a solution; forming an initial film by spin-coating of the solution; and performing an annealing process on the initial film to form the electroluminescent layer.

In step S14, a second electrode is formed on the electroluminescent layer.

In the display unit of the above embodiment, by providing the functional layer of the luminescent material having the electrical bistable characteristics, the display unit can emit light in the high conductivity state and maintain emitting light after power is removed, and does not emit light in the low conductivity state, so that display and non-display of the display unit are realized. Compared with the existing display unit which needs to be continuously driven to display under an electric field, the display power consumption of the display unit can be reduced. Meanwhile, a self-luminous display is carried out through the material in the electrical bistable device under an external power supply, so that the requirements of a user on a higher refreshing frequency are met. Further, since the luminescent material has a definite luminescent spectrum, defects such as mottle do not occur. Meanwhile, the display unit can be suitable for the electronic paper.

The embodiment of the present disclosure further provides a display substrate, as shown in FIG. 4, including a plurality of display units 4 arranged in an array, and further including a control circuit, and the control circuit is connected to the plurality of display units 4, and is configured to control the display unit 4 to be in the first conductivity state or the second conductivity state, so as to make the display unit 4 emit light or not emit light, thereby implementing display of the display substrate.

When the power is removed as the display unit 4 is in the high conductivity state or the low conductivity state, the display unit 4 still maintains the high conductivity state or the low conductivity state, and accordingly, after the power is removed in the high conductivity state or the low conductivity state, the display unit 4 still maintains the light emitting state or the non-light emitting state, by making the display unit 4 in the embodiment be in the high conductivity state or the low conductivity state under control of the control circuit, not only the image display of the display substrate but also the low power consumption of the display substrate can be realized.

In this embodiment, the control circuit includes a plurality of switching transistors 5, a plurality of gate lines 6 and a plurality of data lines 7, the switching transistors 5 are arranged in an array, each switching transistor 5 includes a gate, a first electrode and a second electrode, the gates of one row of switching transistors 5 are correspondingly coupled to one gate line 6, the first electrodes of one column of switching transistors 5 are correspondingly coupled to one data line 7, the second electrode of each switching transistor 5 is correspondingly coupled to one display unit 4, and the second electrode of the switching transistor 5 is coupled to the first electrode of the display unit 4; the second electrode of the display unit 4 is coupled to a common voltage terminal. With such an arrangement, the display unit 4 can be turned on line by line by a scanning signal on the gate lines 6, so that a frame of image can be displayed by the display substrate. Since the principle of the control circuit controlling the display of the display unit 4 is the same as the principle of the control circuit controlling the display of the sub-pixels in the conventional liquid crystal panel or OLED panel, the details are not repeated herein.

In this embodiment, a plurality of adjacent display units 4 form a display unit combination 8, and the electroluminescent layers of different display units 4 in the display unit combination 8 include luminescent materials of different colors. That is, the display substrate in this embodiment can realize color display.

In this embodiment, three adjacent display units 4 in the row direction, in the column direction, or in the diagonal direction form a display unit combination 8. That is, three sub-pixels constitute one pixel. The electroluminescent layers of the three adjacent display units 4 in the display unit combination 8 include red, green and blue luminescent materials, respectively. With the combination of the display units 4 emitting red light, green light, and blue light, the display units 4 can be made to display various colors, thereby realizing color display of the display substrate.

It should be noted that, the display brightness of the display unit 4 can be adjusted by adjusting the level of the applied voltage when the display unit 4 is in the high conductivity state, so as to adjust the color contrast of the display image of the display substrate.

In order to improve the display brightness of the electrical bistable display unit, the applied voltage of the display unit with the green electroluminescent material in the high conductivity state can be increased to 8V~18V. The applied voltage of the display unit with the red electroluminescent material in the high conductivity state can be increased to 6V~18V, and the applied voltage of the display unit with the blue anthracene material in the high conductivity state can be increased to 16V~18V. In summary, the turn-on voltage of the display unit can be set to be more than 16V, and the specific setting may be performed according to the requirements of the display brightness.

In addition, the color combination principle of the three display units 4 in each display unit combination 8 is the same as that of three sub-pixels of different colors in each pixel of the conventional liquid crystal panel or OLED panel, and is not described herein again.

As shown in FIG. 5, the display substrate further includes a substrate 9 (e.g., glass), the first electrode 1, the auxiliary layer 32, the electroluminescent layer 31, and the second electrode 2 are sequentially formed on the glass, and an optical clear adhesive (OCA) 10 and a protection film 11 may be further formed on the second electrode.

In the display substrate of this embodiment, with the above display unit, the sub-pixel structures emitting red light, green light, and blue light are respectively made of the luminescent materials having the electrical bistable characteristics, and TFTs are used to control the sub-pixel structures emitting red light, green light, and blue light to be turned on or off, so that the display of light of different colors is realized, and full-color display of an electronic paper is achieved.

Based on the above structure of the display substrate, the present embodiment further provides a method for driving the display substrate, as shown in FIG. 7, which includes steps S21 and S22.

In step S21, in a scanning stage of a frame of image, the control circuit provides a driving voltage to the display unit to enable the display unit to reach a first conductivity state or a second conductivity state.

In step S22, after scanning of the frame of image is finished, the control circuit stops driving of the display unit, and the display unit maintains the first conductivity state or the second conductivity state of the display unit in the scanning stage of the frame of image for a set time period, that is, the display unit maintains light emission or non-light emission for the set time period.

When the display unit is made of a green electroluminescent material, a range of the driving voltage for enabling the display unit to be in the high conductivity state is 8V~18V; when the display unit is made of a red electroluminescent material, a range of the driving voltage for enabling the display unit to be in the high conductivity state is 6V~18V; when the display unit is made of a blue anthracene material, a range of the driving voltage for enabling the display unit to be in the high conductivity state is 16V~18V.

In the driving method, since the display unit can be powered off when reaching the high conductivity state or the low conductivity state, and the display unit still keeps emitting light or does not emit light after the power is turned off, the display substrate can still keep the display state for a set time period after the power is removed, and compared with the existing display substrate requiring continuous power supply during the display, the display energy consumption of the display substrate is greatly reduced.

It should be noted that, after the display substrate performs the display for the set time period, the display unit in the display substrate may be driven again to be in the high conductivity state or the low conductivity state again, so as to implement the display again on the display substrate.

Embodiments of the present disclosure also provide a display substrate, which is different from the display substrate of the above embodiments in that the electroluminescent layers in the display units are made of the same material. That is, the display substrate in this embodiment can realize monochrome display.

It should be noted that the display brightness of the display unit 4 can be adjusted by adjusting the level of the applied voltage when the display unit 4 is in the first conductivity state, so as to adjust the contrast of the display image of the display substrate.

Other structures and driving methods of the display substrate in this embodiment are the same as those of the display substrate in the above embodiment, and are not described herein again.

According to the display substrate provided by the embodiment, with the above display unit, the display units may include the same luminescent material, so that the display substrate can realize monochrome display.

The application scene of the display substrate is a low-power consumption display scene related to an electronic paper, that is, when the display unit in the display substrate reaches a high conductivity state voltage, the display unit emits light, and after power is removed, the display unit emitting light continues to emit light for a certain time; when the display unit in the display substrate reaches a low conductivity state, the display unit does not emit light, and after the power is removed, the display unit continues to keep not emitting light; therefore, the display substrate can reduce the display power consumption compared with the conventional display substrate which is continuously powered.

An embodiment of the present disclosure further provides a display device including the display substrate in the above embodiment.

With the display substrate in the embodiment, not only the normal display of the display device can be realized, but also the display energy consumption of the display device can be reduced.

The application scene of the display device in this embodiment is a low power consumption display scene related to the electronic paper. That is, when the display unit in the display device reaches the high conductivity state or the low conductivity state, the power is removed, and after the power is removed, the display unit continues to keep the light emitting state or the non-light emitting state for a set time period, so that compared with the display device which needs to be continuously powered during the display, the display power consumption is greatly reduced.

The display device provided in the present disclosure may be any product or member having the above-described display function, or may be a semi-product of the product or member having the above-described display function.

The display unit provided by the disclosure can emit light when being in a high conductivity state and also emit light after the power is removed by the functional layer of the luminescent material with the electrical bistable characteristics, and cannot emit light when being in a low conductivity state, so that display and non-display of the display unit can be realized. Compared with the existing display unit which needs to be continuously driven to display under an electric field, the display power consumption of the display unit can be reduced. Meanwhile, a self-luminous display is carried out through the material in the electrical bistable device under an external power supply, so that the requirements of a user on a higher refreshing frequency is met without processes such as inverting, shaking, writing performed on the black particles and the white particles etc. in the electrophoresis technology to achieve a normal display. Further, since the luminescent material has a definite luminescent spectrum, defects such as mottle do not occur. In addition, the display units may alternatively adopt luminescent materials of different colors to realize the display of light of different colors so as to achieve full-color display. Meanwhile, the display unit may be suitable for an electronic paper.

According to the display substrate provided by the disclosure, by adopting the display unit, not only the image display of the display substrate can be realized, but also the low-power consumption display of the display substrate can be realized. Meanwhile, the display units can adopt luminescent materials of different colors, so that the display substrate can achieve full-color display.

With the display substrate, the display device provided by the disclosure can realize a normal display of the display device and reduce the display energy consumption of the display device. Meanwhile, the display units can include luminescent materials of different colors, so that the display device can achieve full-color display.

It will be understood that, the above embodiments are merely exemplary embodiments employed to illustrate the principles of the present disclosure, and the present disclosure is not limited thereto. It will be apparent to a person skilled in the art that various changes and modifications can be made without departing from the spirit and scope of the disclosure, and these changes and modifications are to be considered within the scope of the disclosure.

What is claimed is:

1. A display unit, comprising:
   a first electrode;
   a second electrode above the first electrode; and
   a functional layer disposed between the first electrode and the second electrode, wherein the functional layer comprises a luminescent material having electrical bistable characteristics,
   wherein the functional layer is configured to emit light at a first set voltage and be in a high conductivity state, and at this case, when the display unit is powered off, the functional layer is still in the high conductivity state and keeps emitting light; the functional layer is configured to be in a low conductivity state at a second set voltage and the functional layer does not emit light when being in the low conductivity state.

2. The display unit according to claim 1, wherein,
   the functional layer comprises an electroluminescent layer and an auxiliary layer, and the electroluminescent layer and the auxiliary layer are superposed on each other, and the auxiliary layer is configured to increase an on-off ratio of the functional layer having the electrical bistable characteristics, and improve a contrast ratio between display and non-display of the display unit.

3. The display unit according to claim 2, wherein,
the electroluminescent layer is made of any one of MEH-PPV, Ir(ppy)3, Alq3, PPV, an anthracene organic material and a fluorene organic material; and
the auxiliary layer is made of any one of PEG, PEO, PEDOT and PMMA.

4. The display unit according to claim 2, wherein,
the first electrode is made of a metal conductive material, and the second electrode is made of a transparent conductive material.

5. The display unit according to claim 4, wherein,
the auxiliary layer is disposed on the first electrode, the electroluminescent layer is disposed on the auxiliary layer, and the second electrode is disposed on the electroluminescent layer, and
the electroluminescent layer is made of Ir(ppy)3, and the auxiliary layer is made of PEO.

6. The display unit according to claim 5, wherein,
a thickness of the electroluminescent layer is in a range of 10 nm to 30 nm, and/or a thickness of the auxiliary layer is in a range of 30 nm to 50 nm.

7. A display substrate, comprising a plurality of display units arranged in an array, wherein
each of the plurality of display units is the display unit according to claim 1; and
the display substrate further comprises a control circuit, the control circuit is coupled to each of the display units to control the display unit to be in a first conductivity state or a second conductivity state and enable the display unit to emit light or not to emit light, so as to realize display of the display substrate.

8. The display substrate according to claim 7, wherein
the control circuit comprises a plurality of switching transistors, a plurality of gate lines and a plurality of data lines, the plurality of switching transistors are arranged in an array, each of the plurality of switching transistors comprises a gate, a first electrode and a second electrode, the gates of one row of the switching transistors are correspondingly coupled to one of the plurality of grid lines, the first electrodes of one column of the switching transistors are correspondingly coupled to one of the plurality of data lines, the second electrode of each of the plurality of switching transistors is correspondingly coupled to one of the plurality of display units, and the second electrode of the switching transistor is coupled to the first electrode of the display unit; and the second electrode of the display unit is coupled to a common voltage terminal.

9. The display substrate according to claim 8, wherein
the electroluminescent layers of the plurality of display units are made of a same material.

10. The display substrate according to claim 8, wherein
a display unit combination is formed by a plurality of adjacent display units, and the electroluminescent layers of different display units in the display unit combination are made of luminescent materials of different colors.

11. The display substrate according to claim 10, wherein
the display unit combination is formed by three adjacent display units in a row direction, a column direction or a diagonal direction.

12. The display substrate according to claim 11, wherein
the electroluminescent layers of the three adjacent display units in the display unit combination include a red electroluminescent material, a green electroluminescent material and a blue electroluminescent material, respectively.

13. The display substrate according to claim 12, wherein
the red electroluminescent material is MEH-PPV, the green electroluminescent material is Ir(ppy)3 or Alq3, and the blue electroluminescent material is PPV, an anthracene organic material or a fluorene organic material.

14. A display device, comprising the display substrate of claim 7.

15. A driving method of the display substrate according to claim 7, comprising:
in a scanning stage of a frame of image, providing, by the control circuit, a driving voltage to the display unit to enable the display unit to reach a first conductivity state or a second conductivity state; and
after scanning of the frame of image is finished, stopping, by the control circuit, driving of the display unit such that the display unit maintains the first conductivity state or the second conductivity state of the display unit in the scanning stage of the frame of image for a set time period.

16. The driving method according to claim 15, wherein
the display unit is made of a green electroluminescent material, and a driving voltage for enabling the display unit to be in the first conductivity state is in a range of 8V to 18V;
the display unit is made of a red electroluminescent material, and a driving voltage for enabling the display unit to be in the first conductivity state is in a range of 6V to 18V; and
the display unit is made of a blue anthracene material, and a driving voltage for enabling the display unit to be in the first conductivity state is in a range of 16V to 18V.

17. A manufacturing method of a display substrate, comprising:
forming a first electrode on a base substrate;
forming an auxiliary layer on the first electrode;
forming an electroluminescent layer on the auxiliary layer; and
forming a second electrode on the electroluminescent layer;
wherein the electroluminescent layer comprises a luminescent material with electrical bistable characteristics,
wherein the functional layer is configured to emit light at a first set voltage and be in a high conductivity state, and at this case, when the display unit is powered off, the functional layer is still in the high conductivity state and keeps emitting light; the functional layer is configured to be in a low conductivity state at a second set voltage and the functional layer does not emit light when being in the low conductivity state.

18. The manufacturing method according to claim 17, wherein the forming an auxiliary layer comprises:
dissolving a material of the auxiliary layer to form a solution;
forming an initial film by spin-coating of the solution; and
performing an annealing treatment on the initial film to form the auxiliary layer such that the auxiliary layer is configured to increase an on-off ratio of the functional layer having the electrical bistable characteristics, and improve a contrast ratio between display and non-display of the display unit.

19. The manufacturing method according to claim 17, wherein the forming an electroluminescent layer comprises:

dissolving a material of the electroluminescent layer to form a solution;
forming an initial film by spin-coating of the solution; and
performing an annealing treatment on the initial film to form the electroluminescent layer.

20. The manufacturing method according to claim 18, wherein,
the electroluminescent layer is made of Ir(ppy)3, and the auxiliary layer is made of PEO.

* * * * *